United States Patent
Liu et al.

(10) Patent No.: US 11,676,792 B2
(45) Date of Patent: Jun. 13, 2023

(54) SAMPLE PRE-CHARGING METHODS AND APPARATUSES FOR CHARGED PARTICLE BEAM INSPECTION

(71) Applicant: ASML Netherlands B.V., Veldhoven (NL)

(72) Inventors: Xuedong Liu, San Jose, CA (US); Qingpo Xi, Fremont, CA (US); Youfei Jiang, San Jose, CA (US); Weiming Ren, San Jose, CA (US); Xuerang Hu, San Jose, CA (US); Zhongwei Chen, San Jose, CA (US)

(73) Assignee: ASML Netherlands, B.V, Veldhoven (NL)

( * ) Notice: Subject to any disclaimer, the term of this patent is extended or adjusted under 35 U.S.C. 154(b) by 0 days.

(21) Appl. No.: 16/652,025

(22) PCT Filed: Sep. 25, 2018

(86) PCT No.: PCT/EP2018/075996
§ 371 (c)(1),
(2) Date: Mar. 27, 2020

(87) PCT Pub. No.: WO2019/063561
PCT Pub. Date: Apr. 4, 2019

(65) Prior Publication Data
US 2020/0266023 A1   Aug. 20, 2020

Related U.S. Application Data

(60) Provisional application No. 62/566,153, filed on Sep. 29, 2017.

(51) Int. Cl.
*H01J 37/12*   (2006.01)
*H01J 37/28*   (2006.01)

(52) U.S. Cl.
CPC .............. *H01J 37/12* (2013.01); *H01J 37/28* (2013.01); *H01J 2237/0048* (2013.01)

(58) Field of Classification Search
CPC .... H01J 37/12; H01J 37/28; H01J 2237/1516; H01J 2237/151; H01J 2237/152;
(Continued)

(56) References Cited

U.S. PATENT DOCUMENTS

| 4,075,488 A | 2/1978 | Okayama et al. |
| 6,924,488 B2 * | 8/2005 | Matsuya ............... H01J 37/153 250/311 |

(Continued)

FOREIGN PATENT DOCUMENTS

| CN | 1452014 A | 10/2003 |
| CN | 101499433 A | 8/2009 |

(Continued)

OTHER PUBLICATIONS

International Search Report and Written Opinion issued in related PCT International Application No. PCT/EP2018/075996, dated Jan. 7, 2019 (14 pgs.).

(Continued)

*Primary Examiner* — Sean M Luck
(74) *Attorney, Agent, or Firm* — Finnegan, Henderson, Farabow, Garrett & Dunner, LLP

(57) ABSTRACT

Disclosed herein is an apparatus comprising: a source of charged particles configured to emit a beam of charged particles along a primary beam axis of the apparatus; a condenser lens configured to cause the beam to concentrate around the primary beam axis; an aperture; a first multi-pole lens; a second multi-pole lens; wherein the first multi-pole lens is downstream with respect to the condenser lens and upstream with respect to the second multi-pole lens; wherein the second multi-pole lens is downstream with respect to the (Continued)

first multi-pole lens and upstream with respect to the aperture.

16 Claims, 13 Drawing Sheets

(58) Field of Classification Search
CPC ......... H01J 2237/153; H01J 2237/1532; H01J 2237/1534; H01J 2237/1505
See application file for complete search history.

(56) References Cited

U.S. PATENT DOCUMENTS

| | | | |
|---|---|---|---|
| 7,253,410 B1 | 8/2007 | Bertsche et al. | |
| 7,619,218 B2 | 11/2009 | Nako et al. | |
| 7,960,696 B2 | 6/2011 | Ezumi et al. | |
| 7,994,476 B2 | 8/2011 | Bullock | |
| 2003/0098415 A1* | 5/2003 | Matsuya | H01J 37/28 250/306 |
| 2003/0122076 A1* | 7/2003 | Matsuya | H01J 37/153 250/311 |
| 2004/0029046 A1 | 2/2004 | Nagano et al. | |
| 2005/0104006 A1 | 5/2005 | Yoshida et al. | |
| 2006/0033037 A1* | 2/2006 | Kawasaki | H01J 37/1478 250/398 |
| 2006/0175548 A1 | 8/2006 | Kawasaki et al. | |
| 2008/0067378 A1* | 3/2008 | Kawasaki | H01J 37/248 250/310 |
| 2008/0078943 A1* | 4/2008 | Kawai | H01J 37/153 250/397 |
| 2008/0093563 A1* | 4/2008 | Sawada | H01J 37/153 250/396 R |
| 2008/0116391 A1* | 5/2008 | Ito | H01J 37/28 250/396 ML |
| 2009/0008551 A1* | 1/2009 | Kawasaki | B82Y 10/00 250/311 |
| 2009/0039281 A1* | 2/2009 | Kawasaki | H01J 37/153 250/396 R |
| 2009/0084954 A1 | 4/2009 | Exumi et al. | |
| 2009/0114817 A1 | 5/2009 | Bullock | |
| 2012/0199739 A1* | 8/2012 | Nakano | H01J 37/153 250/307 |
| 2012/0318978 A1* | 12/2012 | Ren | H01J 37/21 250/310 |
| 2013/0320227 A1* | 12/2013 | Urano | H01J 37/153 250/396 R |
| 2014/0158901 A1* | 6/2014 | Sawada | H01J 37/26 250/396 R |
| 2015/0248944 A1* | 9/2015 | Cheng | H01J 37/153 250/398 |
| 2016/0217967 A1* | 7/2016 | Dohi | H01J 37/1472 |
| 2016/0233049 A1* | 8/2016 | Sasaki | H01J 37/147 |
| 2017/0162362 A1* | 6/2017 | Yoshida | H01J 37/153 |

FOREIGN PATENT DOCUMENTS

| | | |
|---|---|---|
| EP | 2 522 992 A2 | 11/2012 |
| JP | S51-029091 | 3/1976 |
| JP | S58-071545 | 4/1983 |
| JP | H05-325867 | 12/1993 |
| JP | 2002-524827 | 8/2002 |
| JP | 2003-297715 | 10/2003 |
| JP | 2005-149962 | 6/2005 |
| JP | 2006-216396 | 8/2006 |
| JP | 2009-099540 | 5/2009 |
| JP | 2009-164109 | 7/2009 |
| TW | 200933776 A | 8/2009 |
| TW | 201417134 A | 9/2012 |
| WO | WO 00/14765 | 3/2000 |
| WO | WO 2012/126792 A1 | 9/2012 |

OTHER PUBLICATIONS

Bosse et al.; "Comparison of linewidth measurements on COG masks" SPIE Event: 17$^{th}$ European Conference on Mask Technology for Integrated Circuits and Microcomponents; Apr. 9, 2001; doi: 10.1117/12.425082 (13 pgs.).
Colvin, Jim; "A New Technique to Rapidly Identify Low Level Gate Oxide Leakage in Field Effect Semiconductors Using a Scannoing Electron Microscope" ISTFA 1990 (6 pgs.).
Jenkins, Keith A. et al.; "Analysis of Silicide Process Defects by Non-Contact Electron-Beam Charging" CH3084-1/92/0000-0304$01.00 © 1992 IEEE/IRPS (5 pgs.).
Kang, H. et al.; "Methodology and mechanism study on high aspect ratio (HAR) contact bottom image in scanning electron microscopy"; SPIE Event: Microlithography 2005, San Jose, CA; May 10, 2005 (11 pgs.).
Mahant-Shetti, S.S. et al.; "Microstructure isolation testing using a scanning electron microscope"; Appl Phys. Lett 56 (23), Jun. 4, 1990 American Institute of Physics (4 pgs.).
Matsui, Miyako et al.; "Detecting Defects in Cu Metallization Structures by Electron-Beam Wafer Inspection"; Journal of the Electrochemical Society, 151 (6) G440-G442 (2004) (4 pgs.).
Notification of the First Office Action from the Patent Office of the People's Republic of China in related Chinese Patent Application No. 2018800635097; dated Mar. 18, 2022 (14 pgs.).
Notice of Reasons for Rejection issued in related Japanese Patent Application No. 2020-515860; dated May 10, 2021 (11 pgs.).
Notice of Reasons for Rejection issued in related Japanese Patent Application No. 2020-515860; dated Oct. 13, 2021 (9 pgs.).

* cited by examiner

SAMPLE PRE-CHARGING METHODS AND APPARATUSES FOR CHARGED PARTICLE BEAM INSPECTION

CROSS-REFERENCE TO RELATED APPLICATIONS

This application is a national stage filing under 35 U.S.C. § 371 of International Application No. PCT/EP2018/075996, filed on Sep. 25, 2018, and published as WO 2019/063561 A1, which claims priority of U.S. Provisional Application No. 62/566,153, which was filed on Sep. 29, 2017, all of which are incorporated herein by reference in their entireties.

TECHNICAL FIELD

This disclosure relates to methods and apparatuses for inspecting (e.g., observing, measuring, and imaging) samples such as wafers and masks used in a device manufacturing process such as the manufacture of integrated circuits (ICs).

BACKGROUND

A device manufacturing process may include applying a desired pattern onto a substrate. A patterning device, which is alternatively referred to as a mask or a reticle, may be used to generate the desired pattern. This pattern can be transferred onto a target portion (e.g., including part of, one, or several dies) on the substrate (e.g., a silicon wafer). Transfer of the pattern is typically via imaging onto a layer of radiation-sensitive material (resist) provided on the substrate. A single substrate may contain a network of adjacent target portions that are successively patterned. A lithographic apparatus may be used for this transfer. One type of lithographic apparatus is called a stepper, in which each target portion is irradiated by exposing an entire pattern onto the target portion at one time. Another type of lithography apparatus is called a scanner, in which each target portion is irradiated by scanning the pattern through a radiation beam in a given direction while synchronously scanning the substrate parallel or anti parallel to this direction. It is also possible to transfer the pattern from the patterning device to the substrate by imprinting the pattern onto the substrate.

In order to monitor one or more steps of the device manufacturing process (e.g., exposure, resist-processing, etching, development, baking, etc.), a sample, such as a substrate patterned by the device manufacturing process or a patterning device used therein, may be inspected, in which one or more parameters of the sample may be measured. The one or more parameters may include, for example, edge place errors (EPEs), which are distances between the edges of the patterns on the substrate or the patterning device and the corresponding edges of the intended design of the patterns. Inspection may also find pattern defects (e.g., failed connection or failed separation) and uninvited particles.

Inspection of substrates and patterning devices used in a device manufacturing process can help to improve the yield. The information obtained from the inspection can be used to identify defects, or to adjust the device manufacturing process.

SUMMARY

Disclosed herein is an apparatus comprising: a source of charged particles configured to emit a beam of charged particles along a primary beam axis of the apparatus; a condenser lens configured to cause the beam to concentrate around the primary beam axis; an aperture; a first multi-pole lens; a second multi-pole lens; wherein the first multi-pole lens is downstream with respect to the condenser lens and upstream with respect to the second multi-pole lens; wherein the second multi-pole lens is downstream with respect to the first multi-pole lens and upstream with respect to the aperture.

According to an embodiment, the apparatus further comprises a scanning deflector configured to scan the beam relative to a sample.

According to an embodiment, the apparatus further comprises an objective lens configured to focus the beam onto a sample.

According to an embodiment, the apparatus further comprises a third multi-pole lens and a fourth multi-pole lens; wherein the third multi-pole lens is downstream with respect to the aperture; wherein the fourth multi-pole lens is downstream with respect to the third multi-pole lens.

According to an embodiment, the first multi-pole lens and the second multi-pole lens are electrostatic lenses.

According to an embodiment, the first multi-pole lens and the second multi-pole lens each have at least four poles.

According to an embodiment, the poles each have a cross-sectional shape of a section of a ring.

According to an embodiment, the poles each are prismatic or cylindrical.

According to an embodiment, each of the poles is separated from its neighbors by a gap or by a dielectric.

According to an embodiment, the poles are configured to have different electric voltages applied thereto.

According to an embodiment, the first multi-pole lens is configured to stretch the beam in a first direction and to compress the beam in a second direction; the second multi-pole lens is configured to stretch the beam in the second direction and to compress the beam in the first direction.

Disclosed herein is a method comprising: setting a beam of charged particles into a first configuration suitable for pre-charging a sample; pre-charging an area of the sample using the beam of charged particles in the first configuration; setting the beam of charged particles into a second configuration suitable for imaging the sample; imaging the area using the beam of charged particles in the second configuration.

According to an embodiment, the beam of charged particles is generated in an apparatus comprising: a source of charged particles configured to emit the beam of charged particles along a primary beam axis of the apparatus; a condenser lens configured to cause the beam to concentrate around the primary beam axis; an aperture; a first multi-pole lens; a second multi-pole lens; wherein the first multi-pole lens is downstream with respect to the condenser lens and upstream with respect to the second multi-pole lens; wherein the second multi-pole lens is downstream with respect to the first multi-pole lens and upstream with respect to the aperture.

According to an embodiment, setting the beam into the first configuration comprises energizing the first multi-pole lens and the second multi-pole lens.

According to an embodiment, setting the beam into the second configuration comprises de-energizing at least one of the first multi-pole lens and the second multi-pole lens.

According to an embodiment, the apparatus further comprises a third multi-pole lens and a fourth multi-pole lens; wherein the third multi-pole lens is downstream with respect to the aperture; wherein the fourth multi-pole lens is downstream with respect to the third multi-pole lens.

According to an embodiment, setting the beam into the first configuration comprises energizing the third multi-pole lens and the fourth multi-pole lens.

According to an embodiment, setting the beam into the second configuration comprises de-energizing at least one of the third multi-pole lens and the fourth multi-pole lens.

Disclosed herein is a computer program product comprising a non-transitory computer readable medium having instructions recorded thereon, the instructions when executed by a computer implementing any of the above methods.

DETAILED DESCRIPTION

There are various techniques for inspecting the sample (e.g., a substrate and a patterning device). One kind of inspection techniques is optical inspection, where a light beam is directed to the substrate or patterning device and a signal representing the interaction (e.g., scattering, reflection, diffraction) of the light beam and the sample is recorded. Another kind of inspection techniques is charged particle beam inspection, where a beam of charged particles (e.g., electrons) is directed to the sample and a signal representing the interaction (e.g., secondary emission and back-scattered emission) of the charged particles and the sample is recorded.

Figure 1:
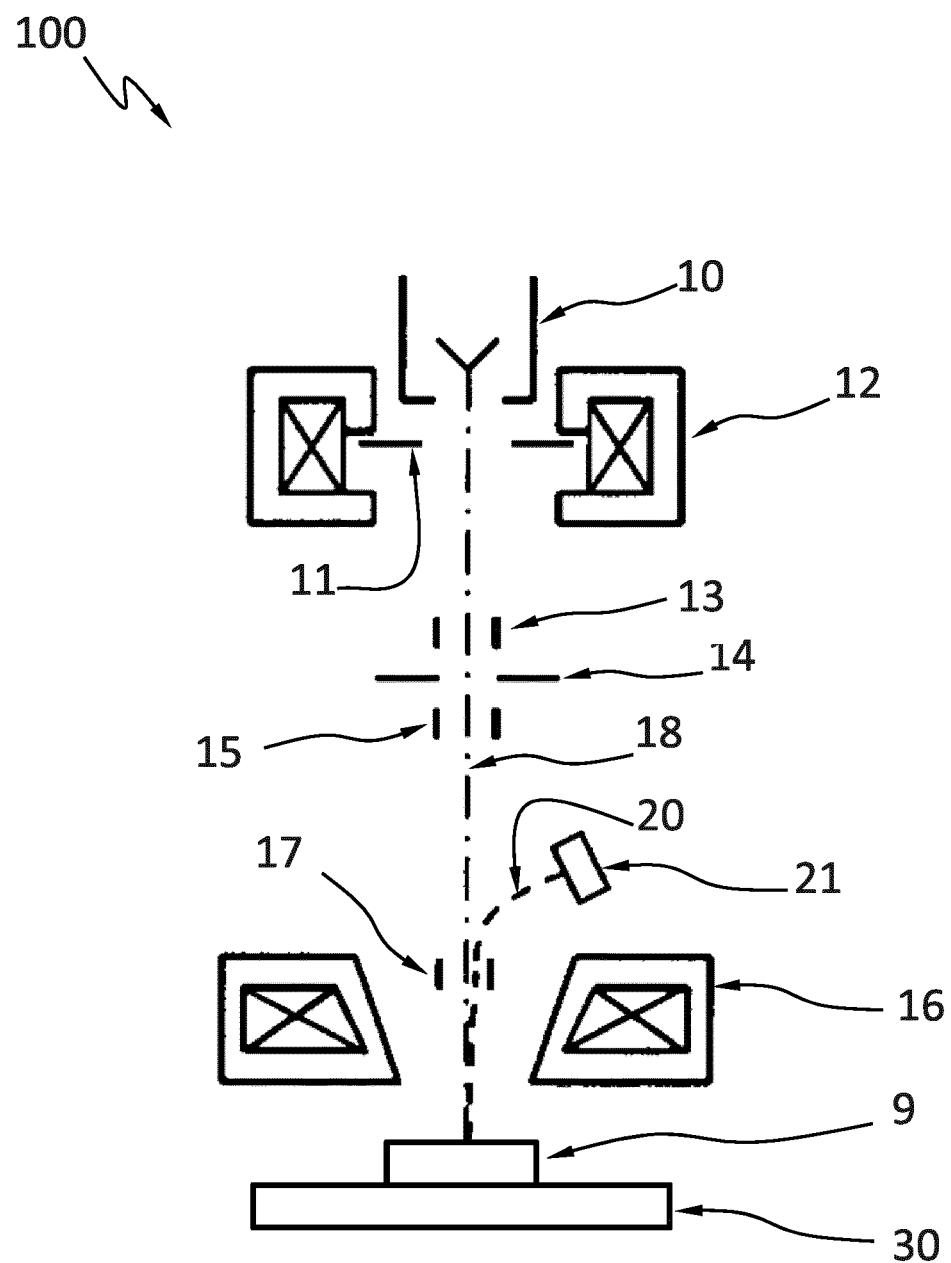
FIG. 1 schematically shows an apparatus that can carry out charged particle beam inspection.

FIG. 1 schematically shows an apparatus 100 that can carry out charged particle beam inspection. The apparatus 100 may include components configured to generate and control a beam of charged particles, such as a source 10 that can produce charged particles in free space, a beam extraction electrode 11, a condenser lens 12, a beam deflector 13, an aperture 14, a scanning deflector 15, and an objective lens 16. The apparatus 100 may include components configured to detect the signal representing the interaction of the beam of charged particles and a sample, such as an E×B charged particle detour device 17, a signal detector 21. The apparatus 100 may also include components, such as a processor, configured to process the signal or control the other components.

In an example of an inspection process, a beam 18 of charged particle is directed to a sample 9 (e.g., a wafer or a mask) positioned on a stage 30. A signal 20 representing the interaction of the beam 18 and the sample 9 is guided by the E×B charged particle detour device 17 to the signal detector 21. The processor may cause the stage 30 to move or cause the beam 18 to scan.

Charged particle beam inspection may have higher resolution than optical inspection due to the shorter wavelengths of the charged particles used in charged particle beam inspection than the light used in optical inspection. As the dimensions of the patterns on the substrate and the patterning device become smaller and smaller as the device manufacturing process evolves, charged particle beam inspection becomes more widely used.

In charged particle beam inspection, electric charges may be applied to a region of a sample before the region is imaged, to better reveal certain features (e.g., voltage contrast defects) in the region. The process of applying the electric charges before imaging may be called pre-charging. Pre-charging may reduce the adverse impact of non-uniform electric charge distribution in the region on imaging, or may enhance contrast by exploiting disparity in the interactions with the electric charges among features in the region.

Pre-charging can be realized by at least two techniques: flooding, and pre-scanning. In the flooding technique, a separate source of electric charges (sometimes called a "flooding gun") is used to provide a relatively large amount of electric charges to charge the region. After the region is flooded with electric charges, a beam of charged particles is used to image region. The sample may move during flooding. Flooding may last for a time period on the order of minutes. Switching from flooding to imaging may take seconds. The relatively long time period for flooding reduces the throughput of the inspection.

In the pre-scanning technique, a beam of charged particles is used both for pre-charging and for imaging. Using the same beam of charged particles both for pre-charging and for imaging allows precise control of pre-charging. The beam of charged particles in a configuration suitable for pre-charging may be scanned across the region before the same beam in a different configuration suitable for imaging is scanned across the region.

Switching between these configurations should be relatively fast. However, if a much higher current density of the beam is needed for pre-charging (e.g., to reveal a thin void in copper interconnects) than for imaging, quickly switching between these configuration may be difficult. The current of the beam may be increased by increasing the current density of the beam through the aperture. Basically, without changing the aperture size, higher current density leads to more electric charges through the aperture per unit time. The current density may be increased by increasing the strength of the condenser lens (e.g., condenser lens 12 in FIG. 1) or by adding an extra electrostatic round lens before the aperture.

The condenser lens may be a magnetic lens. To increase the strength of a magnetic lens, the excitation current of the magnet in the magnetic lens should be changed. Changing the excitation current is slow and precisely controlling the magnitude of the excitation current may be difficult. In addition, the strength of the magnetic lens as a function of the excitation current has hysteresis.

The condenser lens may be an electrostatic round lens. To increase the strength of an electrostatic round lens, the voltage applied to it should be increased. A change of the voltage by a high magnitude (e.g., >1000 V) may be needed to switch between the configuration for pre-charging and the configuration for imaging, but such a change may be slow.

Figure 2A:
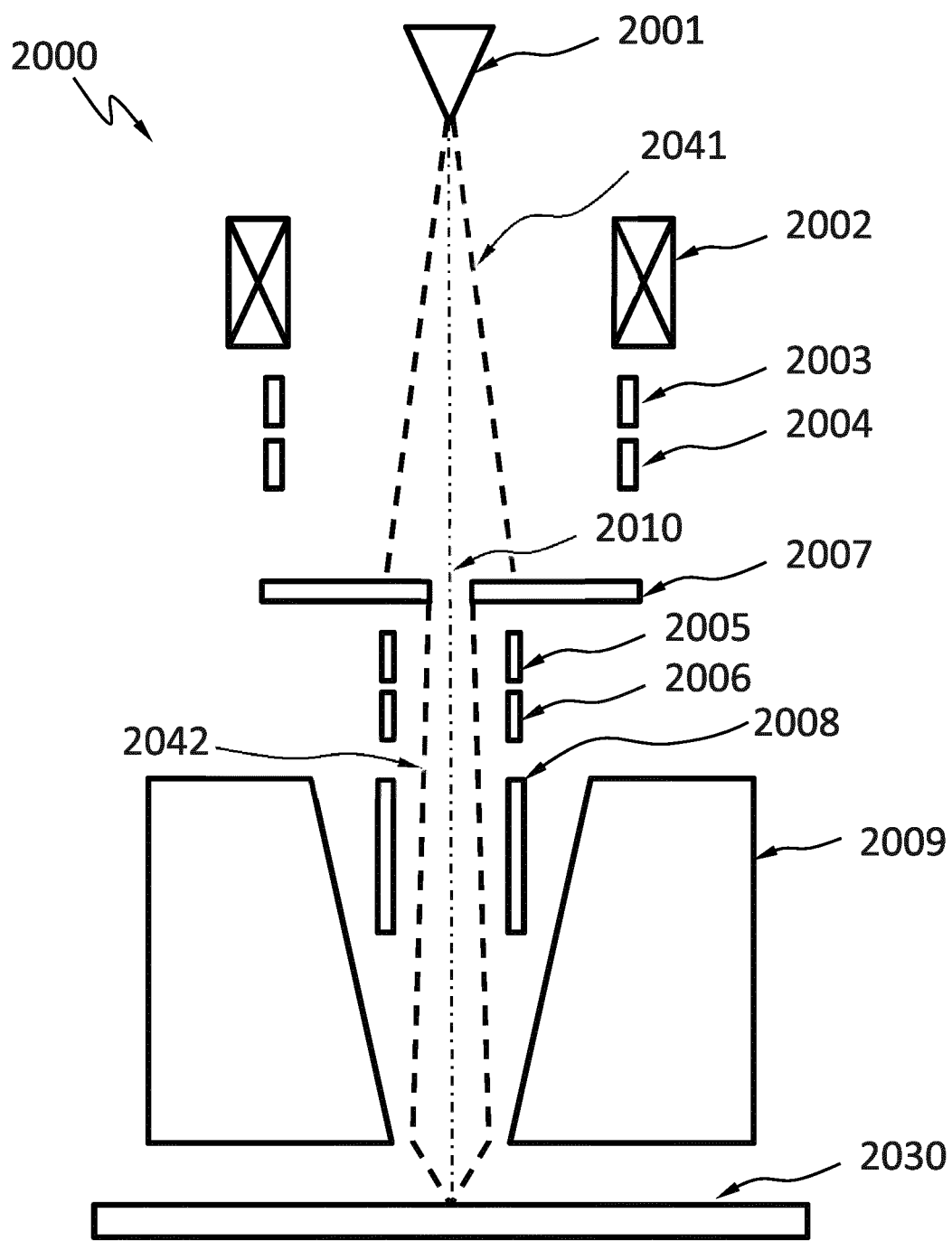
FIG. 2A schematically shows an apparatus that can carry out charged particle beam inspection, where a beam of charged particles may be used both for pre-charging and for imaging, according to an embodiment.
Figure 2B:
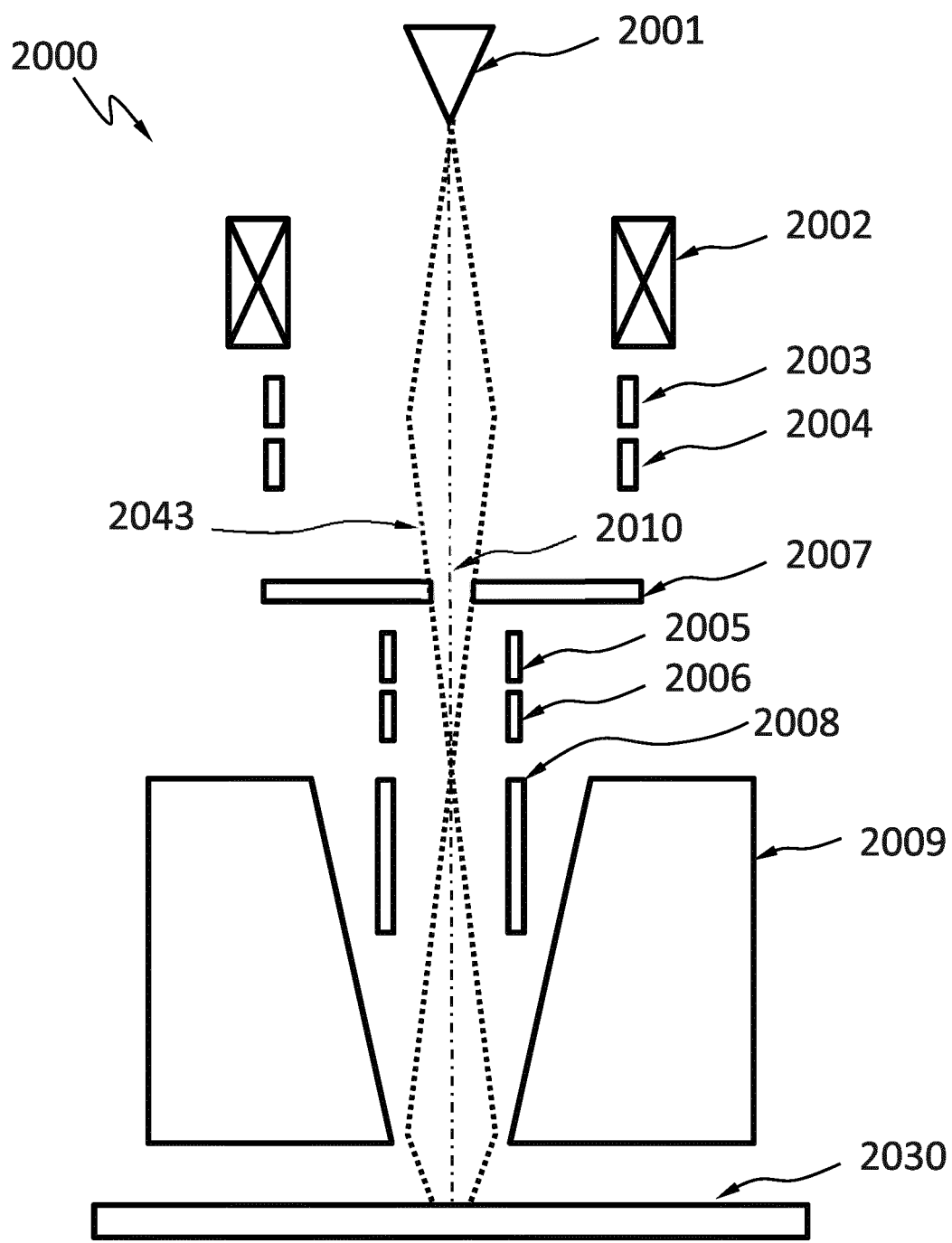
FIG. 2B schematically shows the apparatus of FIG. 2A with two multi-pole lenses energized.

FIG. 2A schematically shows an apparatus 2000 that can carry out charged particle beam inspection, where a beam of charged particles may be used both for pre-charging and for imaging, according to an embodiment. The apparatus 2000 has a source 2001 of charged particles, a condenser lens 2002, and an aperture 2007. The source 2001 is configured to emit a beam of charged particles along the primary beam axis 2010 of the apparatus 2000. The condenser lens 2002 is configured to cause the beam to concentrate around the primary beam axis 2010. Increasing the intensity of the condenser lens 2002 increases the current density of the beam through the aperture 2007. The apparatus 2000 also has a first multi-pole lens 2003 and a second multi-pole lens 2004. The first multi-pole lens 2003 is downstream with respect to the condenser lens 2002 and upstream with respect to the second multi-pole lens 2004. The second multi-pole lens 2004 is downstream with respect to the first multi-pole lens 2003 and upstream with respect to the aperture 2007. The expression "Component A is upstream with respect to Component B" as used herein means that a beam of charged particles would reach Component A before reaching Component B in normal operation of the apparatus. The expression "Component B is downstream with respect to Component A" as used herein means that a beam of charged particles would reach Component B after reaching Component A in normal operation of the apparatus. The apparatus 2000 may further include a scanning deflector 2008 configured to scan the beam relative to a sample 2030, and an objective lens 2009 configured to focus the beam onto the sample 2030. The apparatus 2000 may optionally further include a third multi-pole lens 2005 and a fourth multi-pole lens 2006. The third multi-pole lens 2005 is downstream with respect to the aperture 2007. The fourth multi-pole lens 2006 is downstream with respect to the third multi-pole lens 2005. The apparatus 2000 as shown in FIG. 2A does not have the first multi-pole lens 2003 or the second multi-pole lens 2004 energized. The outer contour 2041 of the beam shows that only a small portion of the beam goes through the aperture 2007. The portion has an outer contour 2042. The apparatus 2000 as shown in FIG. 2B has the first multi-pole lens 2003 and the second multi-pole lens 2004 energized, which causes a much larger portion of the beam to go through the aperture 2007. The beam has an outer contour 2043. The third multi-pole lens 2005 and the fourth multi-pole lens 2006 may be used to shape the beam in the configuration for pre-charging or in the configuration for imaging.

Figure 3:
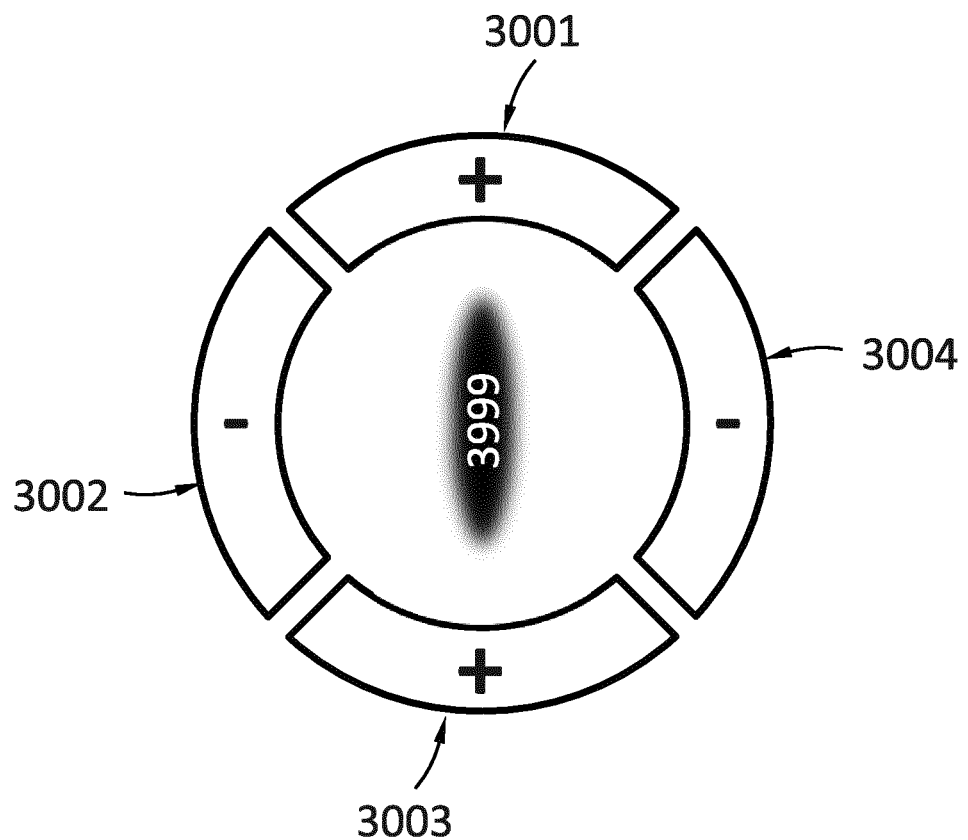
FIG. 3 schematically shows a cross-section of a quadrupole lens as an example of the multi-pole lenses in the apparatus of FIG. 2A and FIG. 2B.

The multi-pole lenses 2003-2006 in the apparatus 2000 may be electrostatic lenses. In an embodiment, the multi-pole lenses 2003-2006 each have at least four poles. For example, the multi-pole lenses 2003-2006 may be quadrupole lenses. FIG. 3 schematically shows a cross-section of a quadrupole lens as an example of the multi-pole lenses 2003-2006. The quadrupole lens has four poles 3001-3004. The poles 3001-3004 may each have a cross-sectional shape of a section of a ring. Each of the poles 3001-3004 may be separated from its neighbors by a gap or by a dielectric. The poles 3001 and 3003 are disposed opposite to each other; the poles 3002 and 3004 are disposed opposite to each other. During use, the poles 3001 and 3003 have a positive voltage applied to them; the poles 3002 and 3004 have a negative voltage applied to them; the positive voltage and the negative voltage have the same absolute value. Under the assumption that the charged particles carry negative charges (e.g., the charged particles are electrons), the beam is stretched along a line connecting the poles 3001 and 3003 and compressed along a line connecting the poles 3002 and 3004.

Namely, the quadrupole lens causes the beam to have an oval-shaped cross-section 3999. For example, the first multi-pole lens 2003 may stretch the beam along a first direction and compress the beam along a second direction, which is different than (e.g., perpendicular to) the first direction; the second multi-pole lens 2004 may stretch the beam along the second direction and compress the beam along the first direction.

Figure 4:
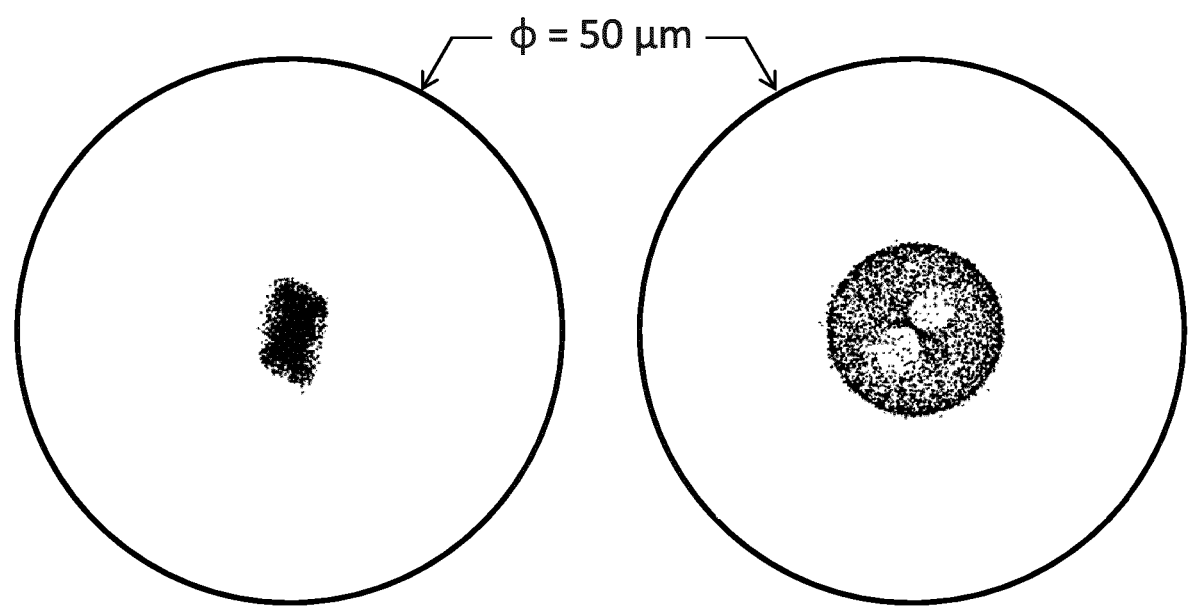
FIG. 4 schematically shows an example of the cross-sectional shape of the beam in the apparatus of FIG. 2B at the aperture (left panel) and at the sample (right panel).

FIG. 4 schematically shows an example of the cross-sectional shape of the beam in the apparatus 2000 at the aperture 2007 (left panel) and at the sample 2030 (right panel), when the multi-pole lenses 2003-2006 are energized. Although the beam at the sample 2030 may not have a uniform current density distribution across the cross-section, the beam may nevertheless be used for pre-charging because beam uniformity is not very important for pre-charging purposes.

Figure 5A:
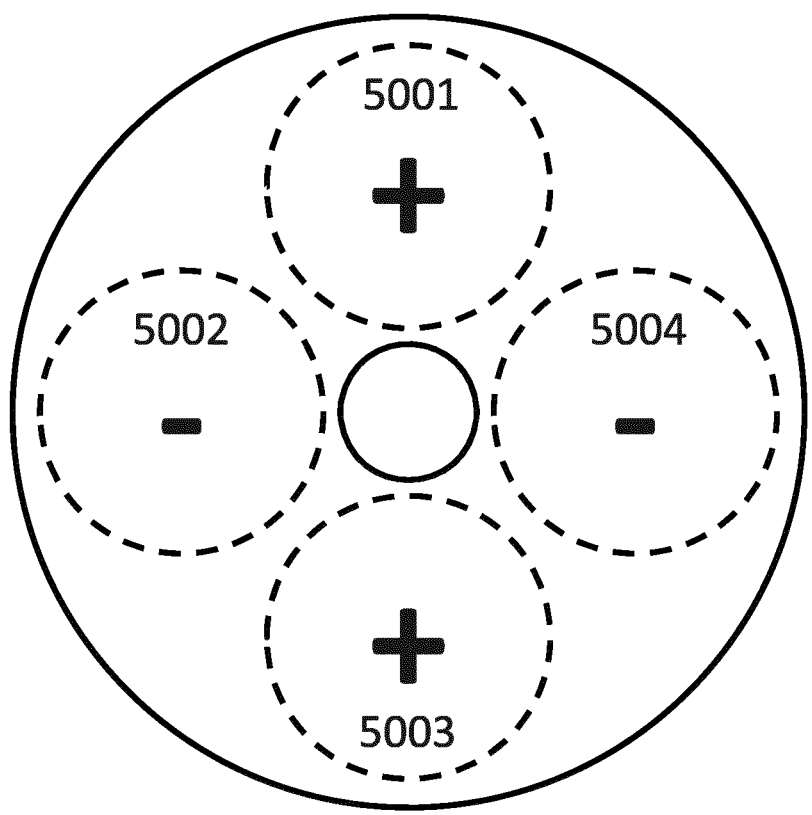
FIG. 5A schematically shows a top view of another quadrupole lens as an example of the multi-pole lenses in the apparatus of FIG. 2A and FIG. 2B.
Figure 5B:
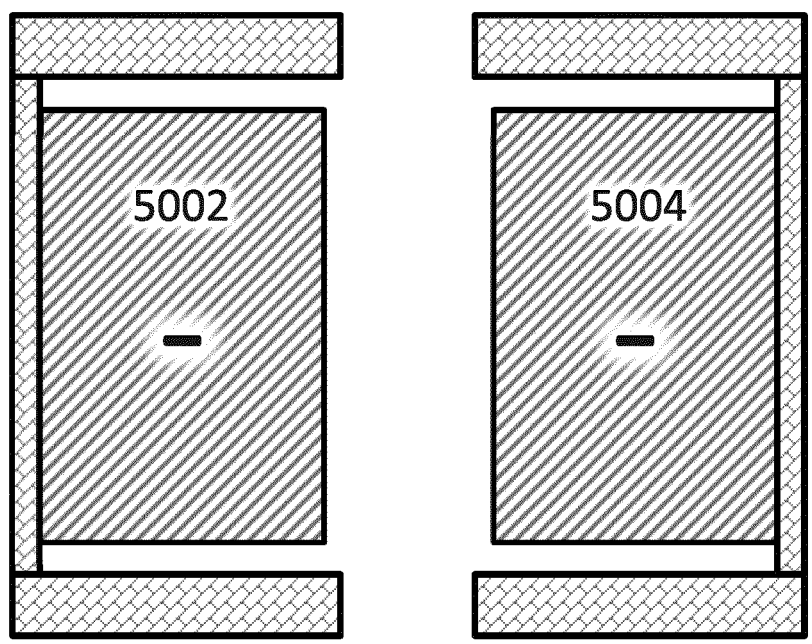
FIG. 5B schematically shows a cross-sectional view of the quadrupole lens of FIG. 5A.

FIG. 5A schematically shows a top view of another quadrupole lens as an example of the multi-pole lenses 2003-2006. FIG. 5B schematically shows a cross-sectional view of the quadrupole lens of FIG. 5A. This quadrupole lens has four prismatic or cylindrical poles 5001-5004. Each of the poles 5001-5004 may be separated from its neighbors by a gap or by a dielectric. The poles 5001 and 5003 are disposed opposite to each other; the poles 5002 and 5004 are disposed opposite to each other. During use, the poles 5001 and 5003 have a positive voltage applied to them; the poles 5002 and 5004 have a negative voltage applied to them; the positive voltage and the negative voltage have the same absolute value. Under the assumption that the charged particles carry negative charges (e.g., the charged particles are electrons), the beam is stretched along a line connecting the poles 5001 and 5003 and squeezed along a line connecting the poles 5002 and 5004.

Figure 6A:
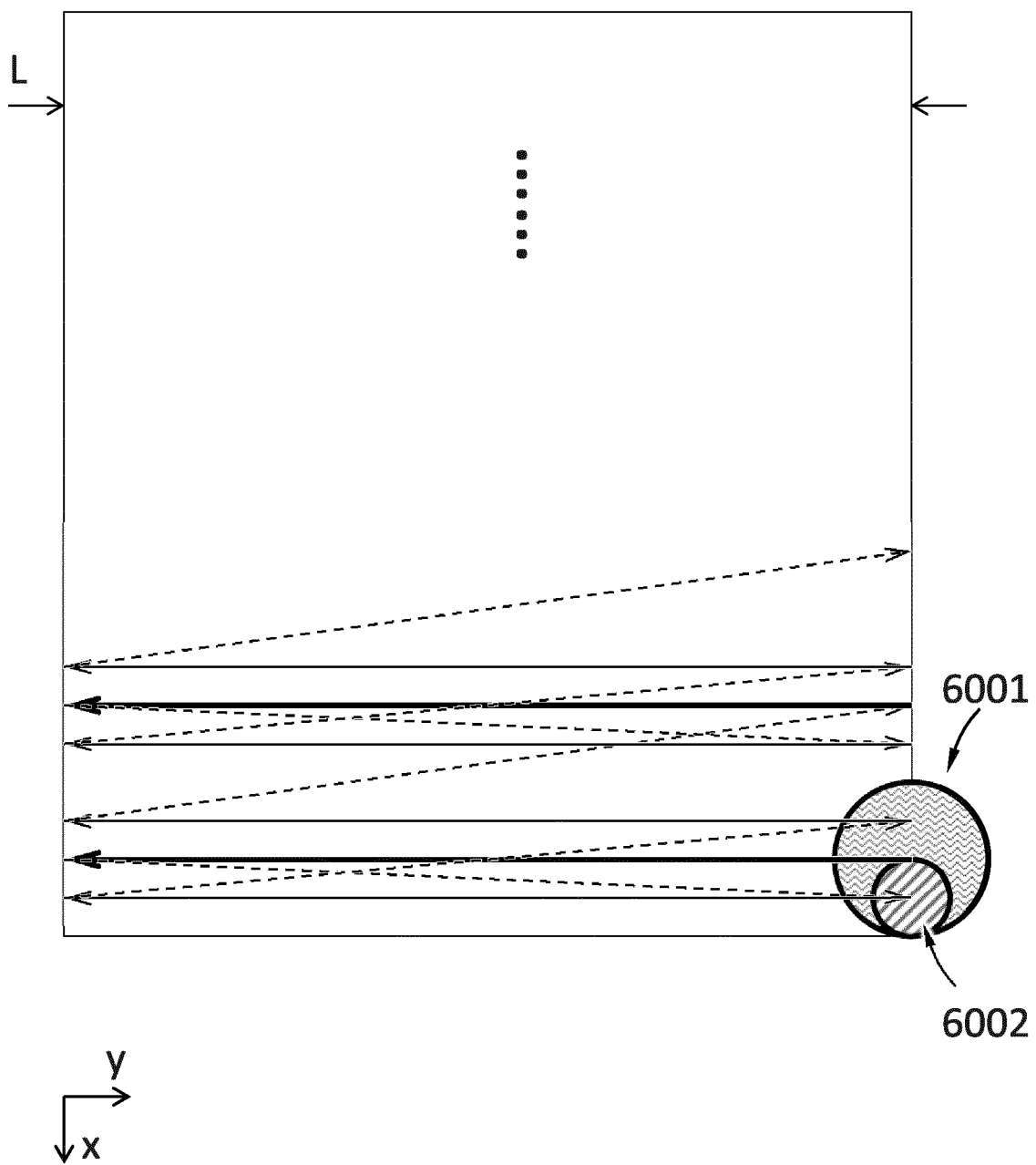
FIG. 6A schematically shows charged particle beam inspection where a beam of charged particles is used both for pre-charging and for imaging, according to an embodiment.

FIG. 6A schematically shows charged particle beam inspection where a beam of charged particles is used both for pre-charging and for imaging, according to an embodiment. For convenience, two directions x and y are defined in a reference frame ("RF") that has no movement relative to the sample. The x and y directions are mutually perpendicular. In this embodiment, the beam is in a configuration suitable for pre-charging and forms a spot 6001 on the sample. The spot 6001 has a diameter of D1. The spot 6001 is scanned in the −y direction by a length L, thereby pre-charging an area of D1 by L. The spot 6001 quickly snaps back in the y direction by the length L and in the x direction by a suitable length (e.g., (D1−D2)/2) and the beam changes into a configuration suitable for imaging and forms a probe spot 6002 on the sample; or the beam changes into a configuration suitable for imaging and forms a probe spot 6002 on the sample and the probe spot 6002 quickly snaps back in the y direction by the length L and in the x direction by a suitable length (e.g., (D1−D2)/2). D2 is the diameter of the probe spot 6002. Signals representing the interactions of the beam and the sample are recorded from the probe spot 6002 while the probe spot 6002 is scanned across the area of D1 by L. For example, the probe spot 6002 may be scanned in the −y direction by L, and quickly snaps back in the y direction by the length L and in the −x direction by D2. This back-and-forth scanning of the probe spot 6002 may be repeated until the probe spot 6002 scans the entirety of the area of D1 by L. The probe spot 6002 quickly snaps back in the y direction by the length L and in the −x direction by a suitable length (e.g., (D1+D2)/2) and the beam changes into a configuration suitable for pre-charging and forms the spot 6001 on the sample; or the beam changes into a configuration suitable for pre-charging and forms the spot 6001 on the sample and the spot 6001 quickly snaps back in the y direction by the length L and in the −x direction by a suitable length (e.g., (D1+D2)/2). This alternate scanning of the spot 6001 for pre-charging and the probe spot 6002 for imaging may be repeated to inspect a region on the sample. Dotted arrows represent quick snapping of the spot 6001 or the probe spot 6002. Thick solid arrows represent paths of the spot 6001 along which some area of the sample is pre-charged. Thin solid arrows represent paths of the probe spot 6002 along which some area of the sample is imaged.

Figures 6B, 6C:
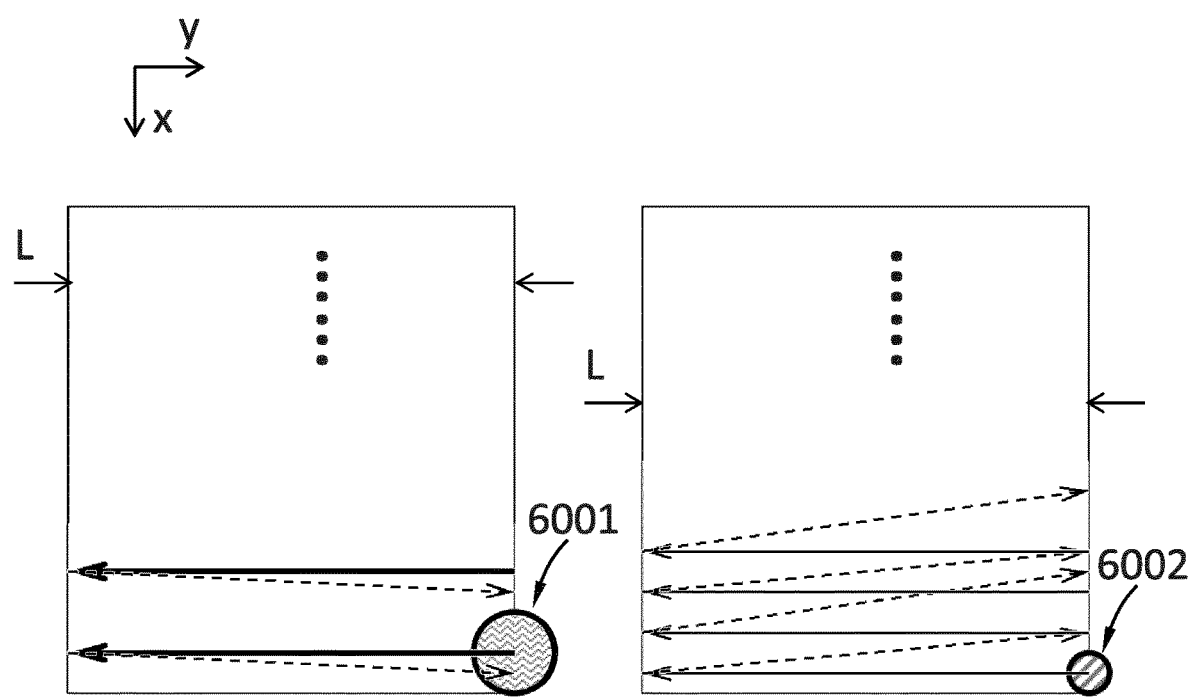
FIG. 6B shows the paths of the spot without showing the paths of the probe spot, in the alternate scanning of the spot for pre-charging and the probe spot for imaging in FIG. 6A.
FIG. 6C shows the paths of the probe spot without showing the paths of the spot, in the alternate scanning of the spot for pre-charging and the probe spot for imaging in FIG. 6A.

FIG. 6B shows the paths of the spot 6001 without showing the paths of the probe spot 6002, in the alternate scanning of the spot 6001 for pre-charging and the probe spot 6002 for imaging in FIG. 6A. FIG. 6C shows the paths of the probe spot 6002 without showing the paths of the spot 6001, in the alternate scanning of the spot 6001 for pre-charging and the probe spot 6002 for imaging in FIG. 6A.

Figure 7A:
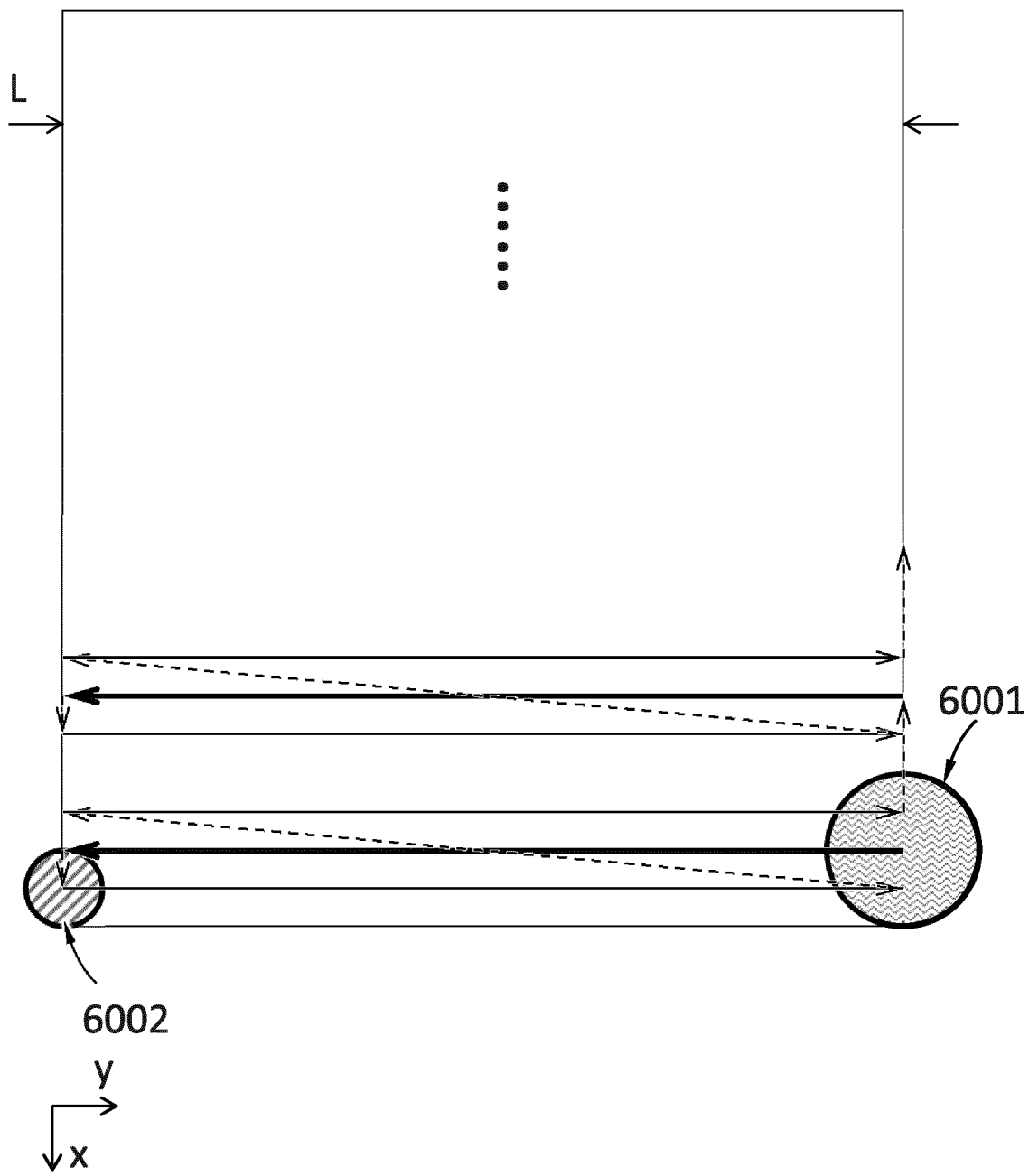
FIG. 7A schematically shows charged particle beam inspection where a beam of charged particles is used both for pre-charging and for imaging, according to an embodiment.

FIG. 7A schematically shows charged particle beam inspection where a beam of charged particles is used both for pre-charging and for imaging, according to an embodiment. For convenience, two directions x and y are defined in a reference frame ("RF") that has no movement relative to the sample. The x and y directions are mutually perpendicular. In this embodiment, the beam is in a configuration suitable for pre-charging and forms a spot 6001 on the sample. The spot 6001 is scanned in the −y direction by a length L, thereby pre-charging an area of D1 by L. The spot 6001 quickly snaps back in the x direction by a suitable length (e.g., (D1−D2)/2) and the beam changes into a configuration suitable for imaging and forms a probe spot 6002 on the sample; or the beam changes into a configuration suitable for imaging and forms a probe spot 6002 on the sample and the probe spot 6002 quickly snaps back in the x direction by a suitable length (e.g., (D1−D2)/2). Signals representing the interactions of the beam and the sample are recorded from the probe spot 6002 while the probe spot 6002 is scanned across the area of D1 by L. For example, the probe spot 6002 may be scanned in the y direction by L, and quickly snaps back in the −y direction by the length L and in the −x direction by D2. This back-and-forth scanning of the probe spot 6002 may be repeated until the probe spot 6002 scans the entirety of the area of D1 by L. The probe spot 6002 quickly snaps back in the −x direction by a suitable length (e.g., (D1+D2)/2) and the beam changes into a configuration suitable for pre-charging and forms the spot 6001 on the sample; or the beam changes into a configuration suitable for pre-charging and forms the spot 6001 on the sample and the spot 6001 quickly snaps back in the −x direction by a suitable length (e.g., (D1+D2)/2). This alternate scanning of the spot 6001 for pre-charging and the probe spot 6002 for imaging may be repeated to inspect a region on the sample. Dotted arrows represent quick snapping of the spot 6001 or the probe spot 6002. Thick solid arrows represent paths of the spot 6001 along which some area of the sample is pre-charged. Thin solid arrows represent paths of the probe spot 6002 along which some area of the sample is imaged.

Figures 7B, 7C:
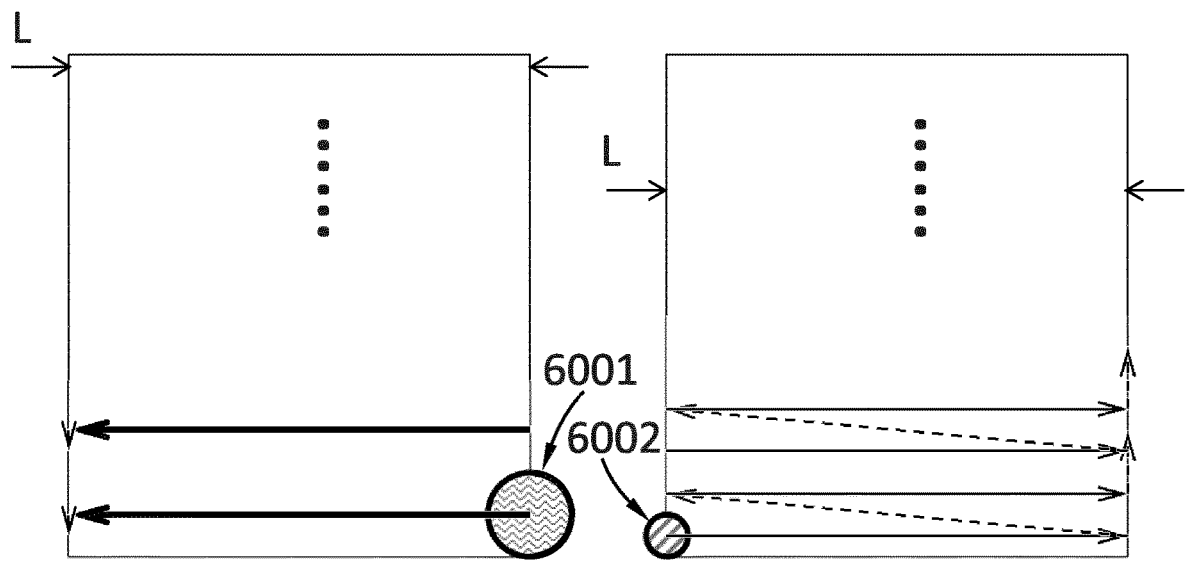
FIG. 7B shows the paths of the spot without showing the paths of the probe spot, in the alternate scanning of the spot for pre-charging and the probe spot for imaging in FIG. 7A.
FIG. 7C shows the paths of the probe spot without showing the paths of the spot, in the alternate scanning of the spot for pre-charging and the probe spot for imaging in FIG. 7A.

FIG. 7B shows the paths of the spot 6001 without showing the paths of the probe spot 6002, in the alternate scanning of the spot 6001 for pre-charging and the probe spot 6002 for imaging in FIG. 7A. FIG. 7C shows the paths of the probe spot 6002 without showing the paths of the spot 6001, in the alternate scanning of the spot 6001 for pre-charging and the probe spot 6002 for imaging in FIG. 7A.

Figure 8A:
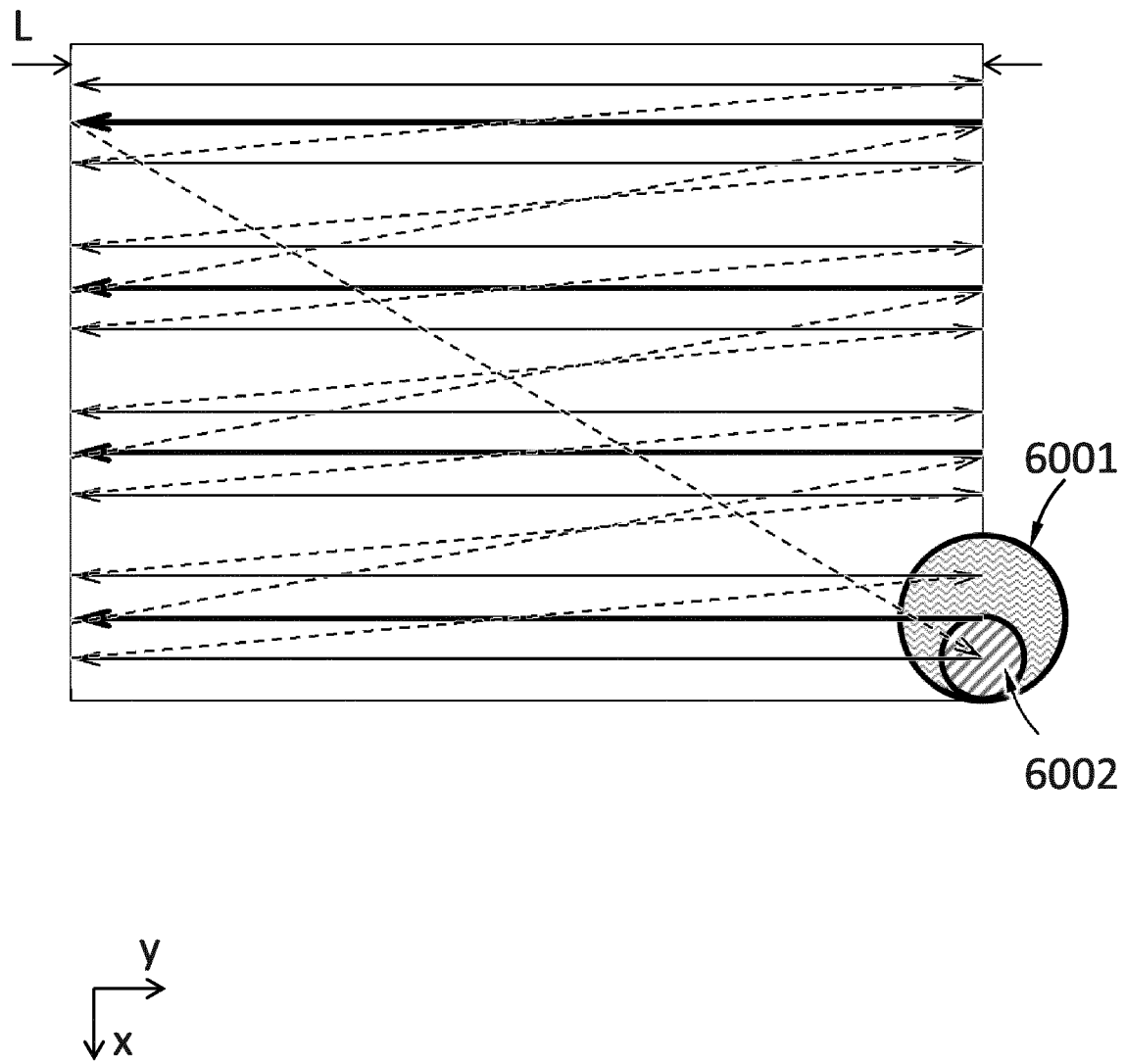
FIG. 8A schematically shows charged particle beam inspection where a beam of charged particles is used both for pre-charging and for imaging, according to an embodiment.

FIG. 8A schematically shows charged particle beam inspection where a beam of charged particles is used both for pre-charging and for imaging, according to an embodiment. For convenience, two directions x and y are defined in a reference frame ("RF") that has no movement relative to the sample. The x and y directions are mutually perpendicular. In this embodiment, the beam is in a configuration suitable for pre-charging and forms a spot 6001 on the sample. The spot 6001 is scanned in the −y direction by a length L, thereby pre-charging an area of D1 by L. The spot 6001 quickly snaps back in the y direction by a length L and in the x direction by D1. The back-and-forth scanning of the spot 6001 is repeated until an entire region of nD1 by L (n being a positive integer) is pre-charged by the spot 6001. The spot 6001 quickly snaps back in they direction by the length L and in the x direction by a suitable length (e.g., (n−1)D1+(D1-D2)/2) and the beam changes into a configuration suitable for imaging and forms a probe spot 6002 on the sample; or the beam changes into a configuration suitable for imaging and forms a probe spot 6002 on the sample and the probe spot 6002 quickly snaps back in the y direction by the length L and in the x direction by a suitable length (e.g., (n−1)D1+(D1−D2)/2). Signals representing the interactions of the beam and the sample are recorded from the probe spot 6002 while the probe spot 6002 is scanned across the region of nD1 by L. For example, the probe spot 6002 may be scanned in the −y direction by L, and quickly snaps back in the y direction by the length L and in the −x direction by D2. This back-and-forth scanning of the probe spot 6002 may be repeated until the probe spot 6002 scans the entirety of the region of nD1 by L. Dotted arrows represent quick snapping of the spot 6001 or the probe spot 6002. Thick solid arrows represent paths of the spot 6001 along which some area of the sample is pre-charged. Thin solid arrows represent paths of the probe spot 6002 along which some area of the sample is imaged.

Figures 8B, 8C:
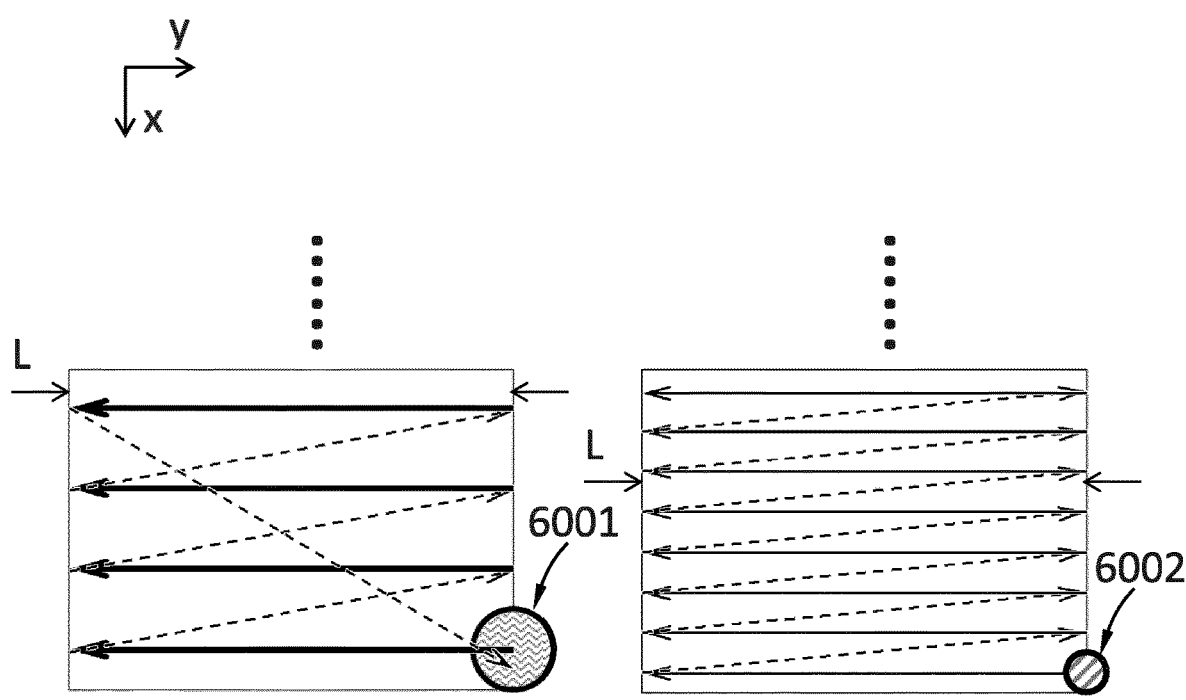
FIG. 8B shows the paths of the spot without showing the paths of the probe spot, in the alternate scanning of the spot for pre-charging and the probe spot for imaging in FIG. 8A.
FIG. 8C shows the paths of the probe spot without showing the paths of the spot, in the alternate scanning of the spot for pre-charging and the probe spot for imaging in FIG. 8A.

FIG. 8B shows the paths of the spot 6001 without showing the paths of the probe spot 6002, in the alternate scanning of the spot 6001 for pre-charging and the probe spot 6002 for imaging in FIG. 8A. FIG. 8C shows the paths of the probe spot 6002 without showing the paths of the spot 6001, in the alternate scanning of the spot 6001 for pre-charging and the probe spot 6002 for imaging in FIG. 8A.

Figure 9:
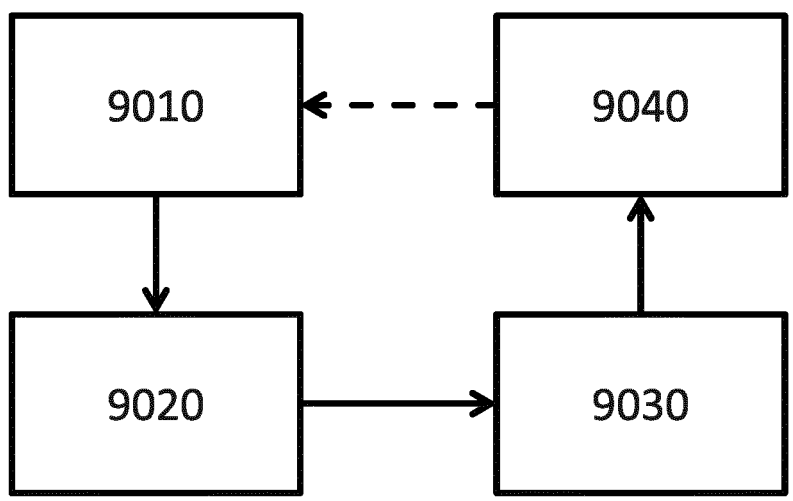
FIG. 9 schematically shows a flowchart for a method for charged particle beam inspection, according to an embodiment.

FIG. 9 schematically shows a flowchart for a method for charged particle beam inspection, according to an embodiment. In step 9010, a beam of charged particles is set into a configuration suitable for pre-charging a sample. In step 9020, an area of the sample is pre-charged using the beam of charged particles in the configuration suitable for pre-charging. In step 9030, the same beam of charged particles is set into a configuration suitable for imaging the sample. In step 9040, the area of the sample is imaged using the beam of charged particles in the configuration suitable for imaging. The flow may go back to step 9010. Step 9030 does not have to be performed immediately after step 9020. In an example in which the beam of charged particles is generated using the apparatus 2000 describe above, setting the beam into the configuration suitable for pre-charging may include energizing the first multi-pole lens 2003 and the second multi-pole lens 2004, and optionally the third multi-pole lens 2005 and the fourth multi-pole lens 2006 if they are present. Setting the beam into the configuration suitable for imaging may include de-energizing at least one of the first multi-pole lens 2003 and the second multi-pole lens 2004, and optionally at least one of the third multi-pole lens 2005 and the fourth multi-pole lens 2006 if they are present.

The embodiments may further be described using the following clauses:

1. An apparatus comprising:
a source of charged particles configured to emit a beam of charged particles along a primary beam axis of the apparatus;
a condenser lens configured to cause the beam to concentrate around the primary beam axis;
an aperture;
a first multi-pole lens;
a second multi-pole lens;
wherein the first multi-pole lens is downstream with respect to the condenser lens and upstream with respect to the second multi-pole lens;
wherein the second multi-pole lens is downstream with respect to the first multi-pole lens and upstream with respect to the aperture.

2. The apparatus of clause 1, further comprising a scanning deflector configured to scan the beam relative to a sample.

3. The apparatus of any one of clauses 1 or 2, further comprising an objective lens configured to focus the beam onto a sample.

4. The apparatus of any one of clauses 1 through 3, further comprising a third multi-pole lens and a fourth multi-pole lens;
wherein the third multi-pole lens is downstream with respect to the aperture;
wherein the fourth multi-pole lens is downstream with respect to the third multi-pole lens.

5. The apparatus of any one of clauses 1 through 4, wherein the first multi-pole lens and the second multi-pole lens are electrostatic lenses.

6. The apparatus of any one of clauses 1 through 5, wherein the first multi-pole lens and the second multi-pole lens each have at least four poles.

7. The apparatus of clause 6, wherein the poles each have a cross-sectional shape of a section of a ring.

8. The apparatus of clause 6, wherein the poles each are prismatic or cylindrical.

9. The apparatus of clause 6, wherein each of the poles is separated from its neighbors by a gap or by a dielectric.

10. The apparatus of clause 6, wherein the poles are configured to have different electric voltages applied thereto.

11. The apparatus of any one of clauses 1 through 10, wherein the first multi-pole lens is configured to stretch the beam in a first direction and to compress the beam in a second direction; wherein the second multi-pole lens is configured to stretch the beam in the second direction and to compress the beam in the first direction.

12. A method comprising:
setting a beam of charged particles into a first configuration suitable for pre-charging a sample;
pre-charging an area of the sample using the beam of charged particles in the first configuration;
setting the beam of charged particles into a second configuration suitable for imaging the sample;
imaging the area using the beam of charged particles in the second configuration.

13. The method of clause 12, wherein the beam of charged particles is generated in an apparatus comprising:
a source of charged particles configured to emit the beam of charged particles along a primary beam axis of the apparatus;
a condenser lens configured to cause the beam to concentrate around the primary beam axis;
an aperture;
a first multi-pole lens;
a second multi-pole lens;
wherein the first multi-pole lens is downstream with respect to the condenser lens and upstream with respect to the second multi-pole lens;
wherein the second multi-pole lens is downstream with respect to the first multi-pole lens and upstream with respect to the aperture.

14. The method of clause 13, wherein setting the beam into the first configuration comprises energizing the first multi-pole lens and the second multi-pole lens.

15. The method of clause 13, wherein setting the beam into the second configuration comprises de-energizing at least one of the first multi-pole lens and the second multi-pole lens.

16. The method of clause 13, wherein the apparatus further comprises a third multi-pole lens and a fourth multi-pole lens;
wherein the third multi-pole lens is downstream with respect to the aperture;
wherein the fourth multi-pole lens is downstream with respect to the third multi-pole lens.

17. The method of clause 16, wherein setting the beam into the first configuration comprises energizing the third multi-pole lens and the fourth multi-pole lens.

18. The method of clause 16, wherein setting the beam into the second configuration comprises de-energizing at least one of the third multi-pole lens and the fourth multi-pole lens.

19. A computer program product comprising a non-transitory computer readable medium having instructions recorded thereon, the instructions when executed by a computer implementing the method of any of clauses 12 through 18.

While the concepts disclosed herein may be used for inspection on a sample such as a silicon wafer or a patterning device such as chrome on glass, it shall be understood that the disclosed concepts may be used with any type of samples, e.g., inspection of samples other than silicon wafers.

The descriptions above are intended to be illustrative, not limiting. Thus, it will be apparent to one skilled in the art that modifications may be made as described without departing from the scope of the claims set out below.

What is claimed is:

1. An apparatus comprising:
   an electron source configured to emit an electron beam along a primary beam axis of the apparatus;
   a condenser lens configured to cause the electron beam to concentrate around the primary beam axis;
   an aperture;
   a first multi-pole lens; and
   a second multi-pole lens,
   wherein the first multi-pole lens is downstream with respect to the condenser lens and upstream with respect to the second multi-pole lens, and
   wherein the second multi-pole lens is downstream with respect to the first multi-pole lens and upstream with respect to the aperture, and
   wherein the first and the second multi-pole lenses are configured to adjust a current of the electron beam to be incident on a sample by adjusting a portion of the electron beam passing through the aperture.

2. The apparatus of claim 1, further comprising a scanning deflector configured to scan the beam relative to a sample.

3. The apparatus of claim 1, further comprising an objective lens configured to focus the beam onto a sample.

4. The apparatus of claim 1, further comprising a third multi-pole lens and a fourth multi-pole lens,
   wherein the third multi-pole lens is downstream with respect to the aperture, and
   wherein the fourth multi-pole lens is downstream with respect to the third multi-pole lens.

5. The apparatus of claim 1, wherein the first multi-pole lens and the second multi-pole lens are electrostatic lenses.

6. The apparatus of claim 1, wherein the first multi-pole lens and the second multi-pole lens each have at least four poles.

7. The apparatus of claim 6, wherein the poles each have a cross-sectional shape of a section of a ring.

8. The apparatus of claim 6, wherein the poles are prismatic or cylindrical.

9. The apparatus of claim 6, wherein each of the poles is separated from its neighbors by a gap or by a dielectric.

10. The apparatus of claim 6, wherein the poles are configured to have different electric voltages applied thereto.

11. The apparatus of claim 1, wherein the first multi-pole lens is configured to stretch the electron beam in a first direction and to compress the electron beam in a second direction, and wherein the second multi-pole lens is configured to stretch the electron beam in the second direction and to compress the electron beam in the first direction.

12. A method using the apparatus of claim 1, the method comprising: setting a beam of charged particles into a first configuration suitable for pre-charging a sample; pre-charging an area of the sample using the beam of charged particles in the first configuration; setting the beam of charged particles into a second configuration suitable for imaging the sample; and imaging the area using the beam of charged particles in the second configuration.

13. The method of claim 12, wherein setting the beam into the first configuration comprises energizing the first multi-pole lens and the second multi-pole lens.

14. A computer program product comprising a non-transitory computer readable medium having instructions recorded thereon, the instructions when executed by a computer implementing the method of claim 12.

15. The apparatus of claim 1, wherein the portion of the electron beam passing through the aperture is based on an activation state of the first multi-pole lens and the second multi-pole lens.

16. The apparatus of claim 15, wherein the first multi-pole lens and the second multi-pole lens are configured to be activated such that substantially all of the electron beam is allowed to pass through the aperture.

* * * * *